(12) United States Patent
Park et al.

(10) Patent No.: US 9,341,691 B2
(45) Date of Patent: May 17, 2016

(54) SHORT TE 3D RADIAL SAMPLING SEQUENCE FOR MRI

(75) Inventors: Jang-Yeon Park, St. Paul, MN (US); Steen Moeller, Golden Valley, MN (US); Ryan Chamberlain, Maplewood, MN (US); Michael G. Garwood, Medina, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 0 days.

(21) Appl. No.: 13/128,830

(22) PCT Filed: Nov. 11, 2009

(86) PCT No.: PCT/US2009/064031
§ 371 (c)(1),
(2), (4) Date: Aug. 2, 2011

(87) PCT Pub. No.: WO2010/056749
PCT Pub. Date: May 20, 2010

(65) Prior Publication Data
US 2011/0288398 A1    Nov. 24, 2011

Related U.S. Application Data

(60) Provisional application No. 61/113,924, filed on Nov. 12, 2008.

(51) Int. Cl.
*A61B 5/05* (2006.01)
*G01R 33/48* (2006.01)
*G01R 33/46* (2006.01)

(52) U.S. Cl.
CPC ........ *G01R 33/4816* (2013.01); *G01R 33/4641* (2013.01)

(58) Field of Classification Search
USPC ............ 600/407–410; 324/306–309; 382/128
See application file for complete search history.

(56) References Cited

U.S. PATENT DOCUMENTS 4,740,748 A * 4/1988 Rzedzian ....................... 324/309
5,122,748 A * 6/1992 Oh et al. ....................... 324/309
(Continued)

FOREIGN PATENT DOCUMENTS

WO    WO-9100514 A1    1/1991
WO    WO-9945842 A1    9/1999
(Continued)

OTHER PUBLICATIONS

"International Application Serial No. PCT/US2009/064031, Search Report mailed Feb. 23, 2010", 4.
(Continued)

*Primary Examiner* — Joel F Brutus
(74) *Attorney, Agent, or Firm* — Schwegman Lundberg & Woessner, P.A.

(57) ABSTRACT

A method for magnetic resonance imaging includes providing a radio frequency excitation pulse to a specimen. The pulse has a duration. The method includes, concurrent with providing the radio frequency excitation pulse, applying a first gradient having a first polarity. The method includes applying a readout gradient at a time after the duration. The readout gradient has inverse polarity relative to the first polarity. The method includes, concurrent with applying the readout gradient, acquiring magnetic resonance data from the specimen. The method includes generating an image based on the magnetic resonance data.

10 Claims, 6 Drawing Sheets

(56) References Cited

U.S. PATENT DOCUMENTS

| | | | |
|---|---|---|---|
| 5,432,448 A * | 7/1995 | Heid et al. | 324/309 |
| 5,926,021 A | 7/1999 | Hennig | |
| 6,127,826 A * | 10/2000 | Thompson et al. | 324/307 |
| 6,522,139 B1 * | 2/2003 | Thompson et al. | 324/307 |
| 6,879,156 B1 | 4/2005 | Chesler | |
| 2004/0245986 A1 * | 12/2004 | Kumai et al. | 324/307 |
| 2005/0073303 A1 * | 4/2005 | Harer et al. | 324/307 |
| 2008/0180098 A1 * | 7/2008 | Takei | 324/309 |
| 2008/0204020 A1 * | 8/2008 | Chamberlain et al. | 324/312 |

FOREIGN PATENT DOCUMENTS

| | | |
|---|---|---|
| WO | WO-2004095049 A1 | 11/2004 |
| WO | WO-2010056749 A1 | 5/2010 |

OTHER PUBLICATIONS

"International Application Serial No. PCT/US2009/064031, Written Opinion mailed Feb. 23, 2010", 11.

J-Y.Park, et al., ""Improved Gradient-Echo 3D Magnetic Resonance Imaging Using Pseudo-Echoes Created by Frequency—Swept Pulses"", vol. 55,, XP002567267 the whole document, (2006), 848-857.

Park, J. Y, et al., "A New Short TE 3D Rad ial Sampl ing Sequence: SWIFT-LiTE", Proc. Intl. Soc. Mag. Reson. Med., 17, (Apr. 2009), 253.

Rahmer, J, et al., ""Selective 3D ultrashort TE imaging: comparison of dual-echo acquisition and magnetization preparation for improving short-T 2 contrast"", Magnetic Resonance Materials in Physics, Biology and Medicine, Chapman and Hall, London, GB, vol. 20, No. 2, ISSN: 1352-8661 see the chapters 'Introduction' and 'Methods' XP019496211, (Mar. 13, 2007), 83-92.

* cited by examiner

SE T₂ WEIGHTED

SWIFT-LITE

SHORT TE 3D RADIAL SAMPLING
SEQUENCE FOR MRI

CROSS-REFERENCE TO RELATED
APPLICATION

This patent application is a nationalization under 35 U.S.C. §371 of PCT Patent Application Serial No. PCT/US2009/064031, entitled "SHORT TE 3D RADIAL SAMPLING SEQUENCE FOR MRI," filed on Nov. 11, 2009, and published as WO 2010/056749 A1 on May 20, 2010, which claims the benefit of priority, under 35 U.S.C. §119(e), to Park et al., U.S. Provisional Patent Application Ser. No. 61/113,924, entitled "SHORT TE 3D RADIAL SAMPLING SEQUENCE," filed on Nov. 12, 2008, the entirety of each of the disclosures of which are explicitly incorporated by reference herein.

STATEMENT REGARDING FEDERALLY
SPONSORED RESEARCH

This invention was made with government support under award number P41-RR008079, P30-NS057091 from the National Institutes of Health. The government has certain rights in this invention.

BACKGROUND

An image produced using magnetic resonance can provide information for purposes of medical diagnosis and treatment. However, satisfactory results cannot be achieved when using conventional imaging techniques with certain types of tissue. For example, imaging of tissue having short $T_2$ components, such as structural and connective tissues (menisci, tendons, and ligaments) as well as hard tissues (such as cortical bones and calcifications) requires specialized and costly equipment.

SUMMARY

One example of the present subject matter includes a magnetic resonance imaging system. The system includes a magnet, a transmitter, a receiver and a processor. The magnet is operable to provide a magnetic field. The transmitter is operable to transmit to a region within the magnetic field. The receiver is operable to receive a magnetic resonance signal from the region. The processor is coupled to the transmitter and coupled to the receiver. The processor is operable to cause the transmitter to provide, to the region, a radio frequency excitation pulse, a first gradient, and a readout gradient. The processor is operable to cause the receiver to generate magnetic resonance data based on the magnetic resonance signal. The processor is configured to provide the radio frequency excitation pulse concurrent with the first gradient. The radio frequency excitation pulse has a first duration and the first gradient has a first polarity. After the duration, the processor is operable to provide the readout gradient. The readout gradient has an inverse polarity relative to the first polarity. While providing the readout gradient, the processor is operable to receive the magnetic resonance signal. The processor is operable to generate an image based on the magnetic resonance data.

One example includes a magnetic resonance imaging system in which the processor is operable to provide a time delay between the duration and the readout gradient. One example includes a magnetic resonance imaging system of any of the previous examples in which the processor is operable to generate the image corresponding to a 3D radial image based on k-space data and wherein the first gradient corresponds to a spoke in the k-space data.

One example includes the magnetic resonance imaging system of any of the previous examples wherein the radio frequency excitation pulse includes a frequency modulated pulse.

One example includes a method. The method includes providing a radio frequency excitation pulse to a specimen wherein the pulse has a duration. The method includes, concurrent with providing the radio frequency excitation pulse, applying a first gradient having a first polarity. In addition, the method includes applying a readout gradient at a time after the duration. The readout gradient has inverse polarity relative to the first polarity. In addition, the method includes, concurrent with applying the readout gradient, acquiring magnetic resonance data from the specimen. The method includes generating an image based on the magnetic resonance data.

One example includes a method in which a magnitude of the readout gradient is substantially equal to a magnitude of the first gradient. One example includes any of the previous methods and further includes waiting a delay period after the duration and before applying the readout gradient. One example includes any of the previous methods and wherein applying the first gradient includes selecting a spoke in k-space data, the k-space data corresponding to a radial image. One example includes any of the previous methods in which providing the radio frequency excitation pulse includes applying a frequency modulated pulse. One example includes any of the previous methods and wherein providing the radio frequency excitation pulse includes applying at least one of a hyperbolic secant pulse or a sinc pulse. One example includes any of the previous methods in which generating the image includes gridding. One method includes any of the previous methods and wherein generating the image includes executing a Fourier transform.

One example includes a machine-readable medium having machine executable instructions for causing one or more processors to execute a method. The method includes providing a radio frequency excitation pulse to a specimen in which the pulse has a duration. In addition, the method includes, concurrent with providing the radio frequency excitation pulse, applying a first gradient having a first polarity. In addition, the method includes applying a readout gradient at a time after the duration, the readout gradient having inverse polarity relative to the first polarity. In addition, the method includes, concurrent with applying the readout gradient, acquiring magnetic resonance data from the specimen. In addition, the method includes generating an image based on the magnetic resonance data.

One method includes any of the previous method and further includes providing a magnetic preparation pulse to the specimen before providing the radio frequency excitation pulse. One example includes any of the previous methods and includes applying the first gradient before providing the radio frequency excitation pulse.

These examples can be combined in any permutation or combination. This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Part 1

The following part describes imaging using short $T_2$ species.

Various imaging techniques can be used for imaging ultrashort $T_2$ species. For example, ultra short echo time (UTE) imaging and sweep imaging with Fourier transformation (SWIFT) are possible techniques, however, both entail using equipment not generally available in a standard clinical MRI system. For example, high performance or fast electronic systems are needed to produce satisfactory results. In addition, UTE imaging has challenges concerning non-uniform sampling and phasing of the free induction decay (FID) that occurs due to data acquisition during the gradient ramp. UTE and SWIFT can be used for imaging tissues with very short $T_2$ components (on the order of a few tens to hundreds of microseconds). Structure and connective tissues such as menisci, tendons, and ligaments, as well as hard tissues (like cortical bones and calcifications) contain a majority of short $T_2$ relaxation time components.

Signals from such short $T_2$ components are not easily detected with conventional imaging techniques. For example, even in fast gradient-echo (GRE) imaging, the shortest achievable echo time (TE) is about 1~2 ms on most clinical scanners. Signals from short $T_2$ components can be captured by the UTE and SWIFT methods because the acquisition delay is very short in these techniques. The concept of TE is not appropriate in UTE and SWIFT because there is no true TE; therefore, the term "acquisition delay" is used here as an alternative for TE. The acquisition delay is defined as the sum of half of the excitation pulse length and the dead time (the time from the end of the excitation pulse to the beginning of acquisition) in UTE, and the sum of the dead time and half of one pulse segment in SWIFT.

In UTE imaging, data acquisition begins right after RF excitation as the readout gradient begins to ramp up, which minimizes the acquisition delay. The achievable acquisition delay is approximately 40~200 µs on most clinical scanners, and possibly ~8 µs. In SWIFT, data acquisition and RF excitation are performed in a time-shared manner. In other words, time-domain signals are acquired at every pulse segment during the pulse duration, which allows the acquisition delay to be almost zero. In practice, the minimum acquisition delay is ~5 µs, but it can be reduced to 1~2 µs with a suitable digital receiver.

Imaging ultrashort $T_2$ species can be challenging to implement using standard clinical MRI systems due to the strong hardware requirements. UTE requires large peak $B_1$ power and high gradient performance. UTE and SWIFT both require a short transmit/receive (T/R) switching times and a short coil ring down time. Furthermore, UTE imaging has challenges relating to the non-uniform sampling and phasing of the FID that occur due to the data acquisition during the gradient ramp. For example, difficulties arise in gridding the non-uniformly acquired data because the gradient ramp is not perfectly linear in many cases and the gradients in different axes can have different temporal responses. Another problem caused by the data acquisition during the gradient ramp is phasing the acquired FID signal. A second-order phase correction can be used for phasing the FID if the gradient is changing linearly during the data acquisition, and, if eddy currents exist, the phasing will be more challenging. Similarly, phasing the FID as well as gridding the data is complicated by the first data point acquired before the gradient ramp begins.

An example of the present subject matter can be used for imaging short $T_2$ species. One example includes a 3D radial spoiled GRE imaging technique that uses a frequency-modulated (FM) pulse like the hyperbolic-secant (HS) pulse (sech/tanh) for excitation. As such, the initial dephasing of the readout gradient is performed during RF excitation rather than afterwards and can be used for imaging species having short range of TE>~0.3 ms without requiring a time delay for the dephasing gradient or the phase-encoding gradient before data acquisition. Since gradient echoes are acquired, it can have some SNR benefit over FID acquisition imaging techniques like UTE, as well as avoiding phasing and non-uniform sampling problems. It can also be implemented using standard scanners equipped with proton-free coils.

Figure 1:
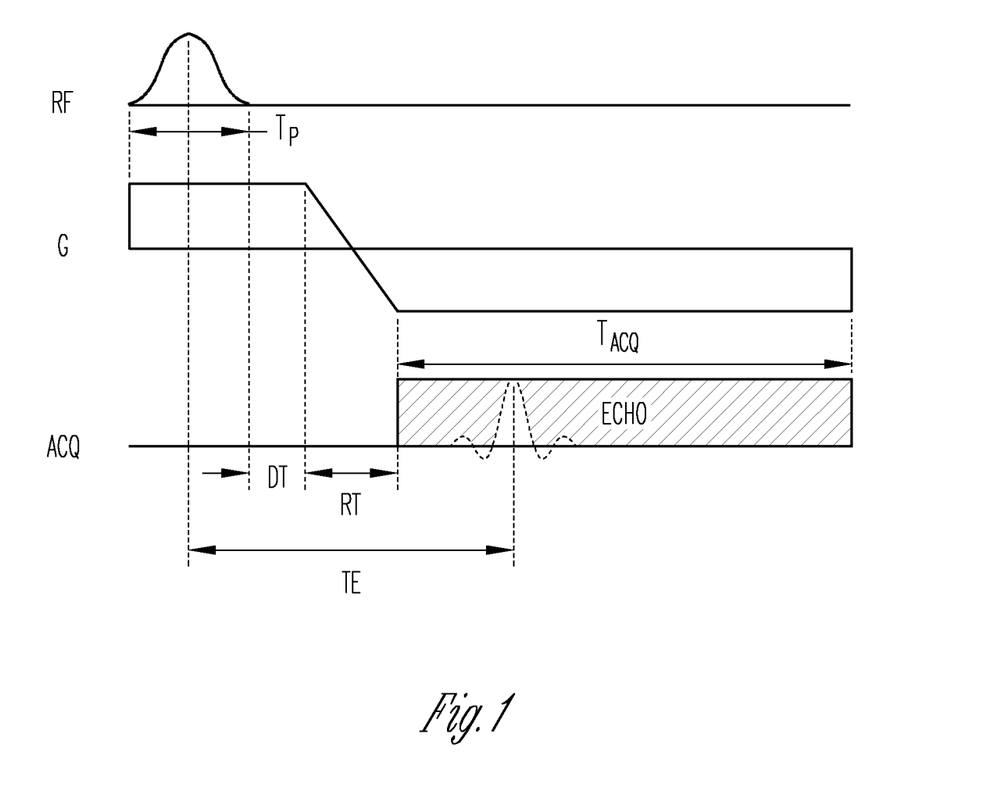
FIG. 1 includes a timing diagram according to one example.

FIG. 1 includes a timing diagram according to one example. The timing diagram illustrates a radio frequency (RF) excitation pulse (timeline RF) having duration (or length) $T_p$. As shown in the figure, the excitation pulse occurs concurrent with a lobe of the readout gradient (timeline G). The lobe, sometimes referred to as an initial dephasing lobe, is applied during the duration of the RF excitation pulse.

At some point in time after $T_p$, the readout gradient (sometimes referred to as a first gradient) is turned off and the gradient amplitude, as shown, ramps down to form an inverse gradient (sometimes referred to as a second gradient). The time during which the readout gradient transitions from the first gradient to the inverse gradient is denoted in the figure as RT which represents a gradient ramp time.

The time period denoted in the figure as DT represents a delay time between RF excitation ($T_p$) and gradient ramp (RT). Delay time DT can be used for echo time (TE) weighting and in one example, is set to zero. For example, DT can be set to zero for short TE imaging and non-zero for increased TE.

As shown in the figure, the magnetic resonance signal is acquired during the acquisition time period denoted as $T_{acq}$. Also as shown, the echo corresponding to the inverse gradient occurs at time TE. In addition, $T_{short}$ represents the length of the short side of the asymmetric echo and is given by (TE−RT)/2. The expected TE=$T_p$+RT+2DT.

Other configurations of excitation and gradient are also contemplated. For example, the alignment as to the RF excitation pulse and the first gradient can be shifted so that a portion of the excitation pulse precedes onset of the first gradient. In one example, the first gradient can end before the end of the RF excitation pulse. In other words, the RF excitation pulse and the first gradient can be wholly overlapping or partially overlapping in the time domain.

The figure illustrates a single first gradient, however, in one example, multiple gradients are provided concurrent with the RF excitation pulse.

The pulse diagram of FIG. 1 differs from a spoiled GRE image in a number of ways. Among other things, the initial dephasing lobe of the readout gradient is applied during the RF excitation, which allows a shorter TE than conventional GRE imaging. In addition, an (asymmetric) echo is acquired in the present subject matter using a spatial encoding scheme whereas a free induction decay (FID) is acquired in UTE imaging.

In the present subject matter, slab selection and the initial dephasing for the readout are performed with the same gradient. In other words, the initial dephasing lobe of the spatial encoding is applied during RF excitation and not after excitation. As such, the present subject matter can achieve a shorter TE than conventional GRE imaging sequences using either of Cartesian or radial sampling.

In one example, a frequency modulated (FM) hyperbolic secant (HS) pulse is used for RF excitation. The HS pulse is used to excite a low-tip angle in the presence of gradient. The slab width is selected to be greater than the object dimensions. In one example, the RF excitation pulse includes a CHIRP pulse.

Non-FM pulses, like a sinc pulse, can also be used for excitation. The HS pulse delivers a flat and broad excitation profile having a reduced peak $B_1$ power for a given pulse bandwidth (BW). According to the present subject matter, the acquisition spectral width (SW) is the same as BW.

Furthermore, the non-linear phase produced by the HS pulse can also help to prevent unwanted stimulated and spin echoes without resort to extra spoiling times. According to one example, after RF excitation, the slab-selective gradient is inverted to create a gradient-recalled echo for readout. Acquisition starts when the gradient fully ramps up to the readout plateau, thus avoiding the difficulties of sampling during the ramp.

In one example, the ramp gradients in the x, y, and z axes have the same ramp time (RT) so that the readout gradients in the different axes can start at the same time, despite their different amplitudes and, thus, different rise times.

The minimum achievable RT depends on the performance of the gradient system and, in one example, is at least twice the rise time of the readout gradient, in order to minimize the non-linearity of the gradient ramp.

In one example, radial samplings are arranged with isotropic angular spacing to cover a sphere in k-space and having a spiral shape of view orders. Several spirals of view orders can be interleaved to increase the number of views (or projections).

With a HS pulse for slab-selective excitation, a non-linear phase variation is produced across the slab since the spins are sequentially excited according to the FM function of the HS pulse. If the readout gradient is applied along the same direction with a gradient of opposite polarity, the vertex of the non-linear phase profile moves across the slab along the opposite direction of the frequency sweep, thus locally rephasing the spin isochromats that correspond to the vertex position sequentially in time. This generates a pseudo-echo in which spins isochromats excited earlier or later are rephased later or earlier in a time-symmetric manner. If the magnitude of the readout gradient is the same as that of the slab-selective gradient, the minimum time that is required to capture the pseudo-echo is theoretically expected to be the same as the pulse length ($T_p$) of the HS pulse. From a practical viewpoint, $T_p$ of a couple of hundred microseconds is suitable for short TE imaging when considering the BW and peak $B_1$ power.

In one example, the acquisition time ($T_{acq}$) can be on the order of a few milliseconds, which is determined by the number of sampling points and the SW. If $T_p$ is much shorter than the acquisition time, then the peak of the pseudo-echo is formed near the beginning of the acquisition time. As a result, the echoes used to fill the k-space in radial directions (i.e., the spokes) are asymmetric in terms of the origin of k-space.

The excitation pulse can be frequency modulated (or phase modulated) or amplitude modulated. One example of a frequency modulated (or frequency swept) pulse is an HS pulse. One example of an amplitude modulated excitation pulse is a sinc pulse. In addition to a sinc pulse, other types of slab-selective amplitude modulated pulses are also suitable for one example of the present subject matter.

In comparison with an HS pulse, the sinc pulse has a disadvantage with respect to peak $B_1$ power. As noted, the present subject matter uses substantially similar bandwidths for the acquisition (SW) and the excitation pulse (BW) bandwidths. Thus, an increase of SW (for example, to shorten TE, TR, or both TE and TR) entails a corresponding increase in BW. Unlike the HS pulse, to increase the BW of the sinc pulse is to decrease its length. Therefore, the practical peak $B_1$ limit is reached sooner with the sinc pulse as compared with the HS pulse. For example, in comparison with an HS pulse (in which the time-bandwidth product $R=T_p \cdot BW=20$), a sinc pulse with five lobes entails approximately 4-fold higher peak $B_1$ power.

The peak $B_1$ power problem associated with the sinc pulse may be overcome by setting the slab-selective gradient to a smaller value than that of the readout gradient. However, this approach is limited in that the gradient echo moves toward the ramp of the readout gradient and becomes more asymmetric as the slab-selective gradient amplitude decreases. Eventually, as the slab-selective gradient is further reduced, the top of the echo occurs during the ramp period, and thus, complicating the acquisition. With an HS pulse, on the other hand, the peak $B_1$ is reduced and the excitation pulse profile is flat and broad. If the available peak $B_1$ ever becomes limiting when using the HS pulse, a stretched version of the pulse (namely, HSn) can be used. The family of HSn pulses exhibit reduced peak $B_1$ power by stretching the HS pulse, where n is the stretching factor. As n increases, HSn pulses demand a decreasing amount of peak $B_1$ power because the AM function becomes flatter. In the original HS pulse, n=1 and therefore the pulse is referred to as HS1.

Part 2

The following part provides an analytical comparison.

According to one example of the present subject matter, an (asymmetric) echo is acquired. The echo acquisition offers advantages over the FID acquisition. First, the image reconstruction using the echoes does not have a phasing problem that can occur in the image reconstruction using the FIDs due to missing points in the beginning of the FID. Furthermore, the echo can have an advantage over the FID acquisition in terms of signal-to-noise ratio (SNR). By definition, the average image SNR per pixel can be written as:

$$SNR = \frac{\sqrt{\sum_n |S(n)|^2}}{\sqrt{N_s}\,\sigma_t}, \qquad \text{Equation 1}$$

where $S(n)$ is the $n^{th}$ value of a sampled time-domain signal, $N_s$ is the number of sampling points, and $\sigma_t$ is the standard deviation of the time-domain noise, which is assumed to be the same in the same RF detection system.

When assuming that the FID and a symmetric echo are acquired with the same SW and maximum spatial frequency ($k_{max}$), as well as the same RF detection system, the symmetric echo has the signal energy and $N_s$ both of which are two times larger than the FID. Since the signal energy conceptually corresponds to the argument of the square root in the numerator of Equation 1, the SNR of the symmetric echo is the same as the FID. In the case of an asymmetric echo, the signal energy of the asymmetric echo is also almost two times larger than that of the FID because the asymmetric echo often includes the main lobe of the echo signal, as is the case in the symmetric echo. However, although the $N_s$ of the asymmetric echo is larger than that of the FID, it is not twice as large as that of the FID. In other words, if the acquisition time of the asymmetric echo is $T_{acq}$ and the length of its short side is $T_{short}$ (=(TE−RT)/2), then $N_s$ of the asymmetric echo would be $T_{acq}/(T_{acq}−T_{short})$ times larger than the $N_s$ of the FID. Therefore, according to Equation 1, the SNR of the asymmetric echo will be increased by a factor λ, which is given by $$\lambda = \sqrt{\frac{2(T_{acq} - T_{short})}{T_{acq}}} = \sqrt{2(1 - T_{ratio})}, \quad \text{Equation 2}$$

where $T_{ratio}=T_{short}/T_{acq}=(TE-RT)/2T_{acq}$. Here, since $T_{short} \leq T_{acq}/2$ by definition, $T_{ratio} \leq \frac{1}{2}$ and, thus, TE−RT be less than or equal to $T_{acq}$, i.e. TE−RT≤$T_{acq}$.

Figure 2A:
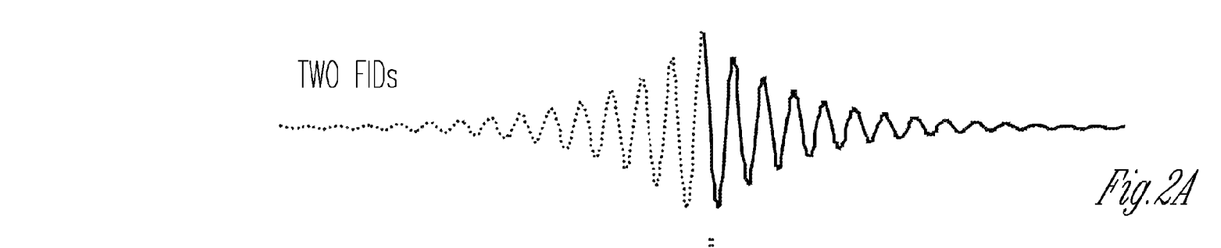
FIGS. 2A, 2B, and 2C include representations of data acquisition.
Figure 2B:
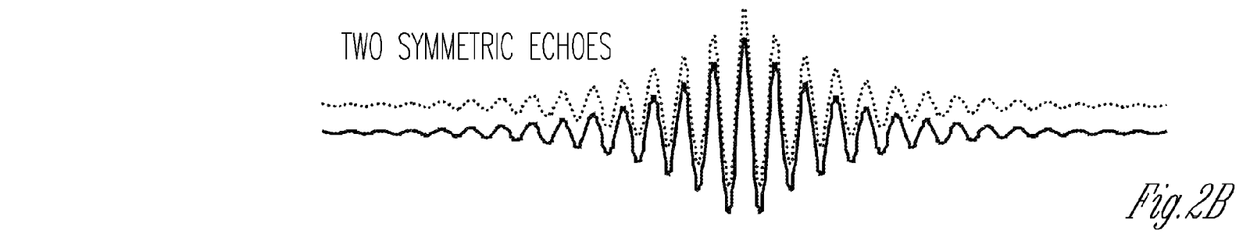
Figure 2C:
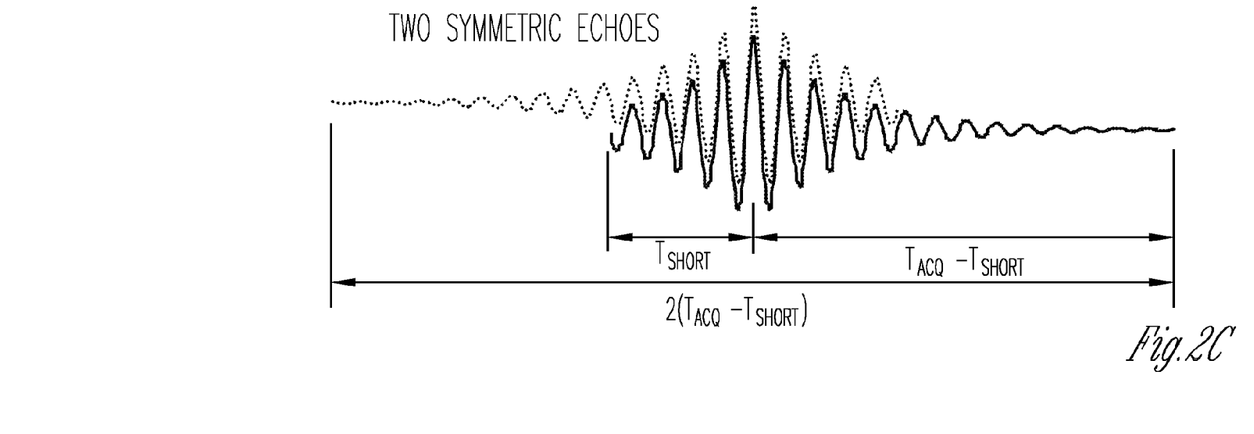

FIGS. 2A, 2B, and 2C illustrate magnetic resonance data acquisition.

In particular, FIG. 2A illustrates FID acquisition in which two FIDs are acquired with opposite gradient polarities combined to form a full symmetric echo in k-space. In UTE imaging, if an FID is acquired for one spoke (from the center to the periphery in one radial direction) that fills the k-space, then another FID needs to be acquired for the spoke that fills the k-space in the opposite radial direction, because a physical object will be complex-valued due to motion and/or magnetic field inhomogeneities.

FIG. 2B illustrates an example of symmetric echo acquisition. In this figure, two symmetric echoes are acquired with opposite gradient polarities and with the same number of projections as the FID acquisition. The signals are averaged to form one symmetric echo in the k-space. In this example, the SNR is improved by a factor of √2 relative to the FID acquisition because two symmetric echoes of opposite directions will be averaged.

FIG. 2C illustrates an example using asymmetric echo acquisition. Two asymmetric echoes are acquired with opposite gradient polarities and are partially averaged to form one symmetric echo in k-space. In this example, SNR is improved by a factor of λ' which is given by Equation 3 (below). The data presented here assumes acquisition with the same SW, $k_{max}$, and the number of projections, in the same RF detection system (thus, guaranteeing the same noise distribution).

Considering that the symmetric echo itself has no SNR advantage over the FID when acquired with the same SW and maximum $k_{max}$ as noted above, the final SNR improvement of the symmetric echo acquisition will be accomplished by a factor of √2. In the case the asymmetric echo of SWIFT-LiTE, however, only the beginning part of two asymmetric echoes will be overlapped and averaged, which corresponds to $2T_{short}$ (as shown in FIG. 2C). Since the length of the final symmetric echo (which is made up of two asymmetric echoes) will be $2(T_{acq}−T_{short})$, the factor (λ') by which SNR is improved will be less than √2, but greater than 1, that is, $$\lambda' = \frac{2(T_{acq} - T_{short}) \times 1 + 2T_{short} \times \sqrt{2}}{2(T_{acq} - T_{short})} \quad \text{Equation 3}$$

$$= \frac{T_{acq} - (2 - \sqrt{2})T_{short}}{T_{acq} - T_{short}}$$

$$= \frac{1 - (2 - \sqrt{2})T_{ratio}}{1 - T_{ratio}}.$$

Thus, the final factor ($\lambda_f$) by which the SNR of the asymmetric echo acquisition is improved will be given by $$\lambda_f = \lambda' \cdot \lambda = \sqrt{2} \cdot \frac{1 - (2 - \sqrt{2})T_{ratio}}{\sqrt{1 - T_{ratio}}}, \quad \text{Equation 4}$$

where $T_{ratio}=T_{short}/T_{acq}=(TE-RT)/2T_{acq}$ as defined above.

Part 3

Figure 3A:
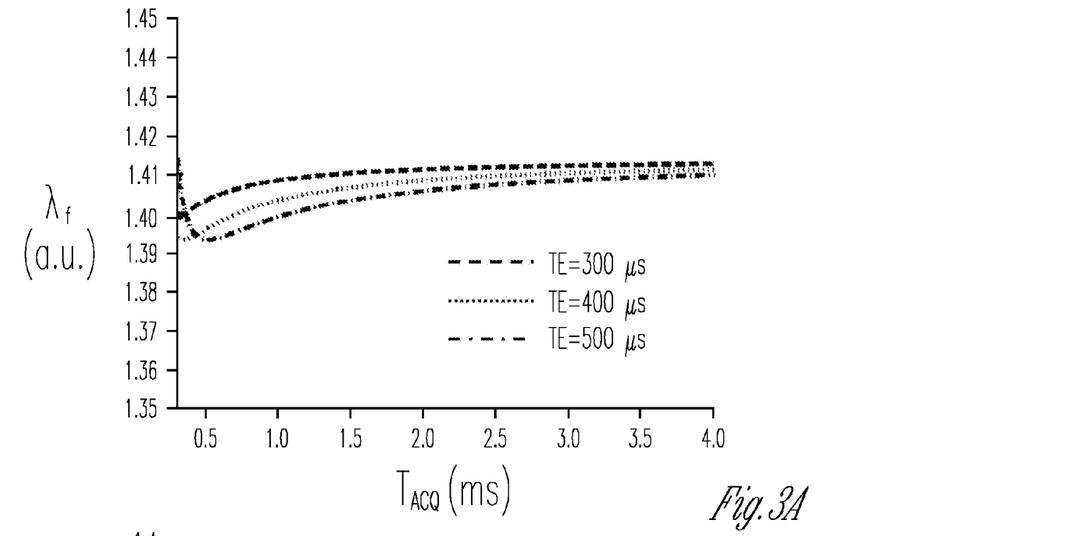
FIGS. 3A and 3B include signal to noise ratio (SNR) data.
Figure 3B:
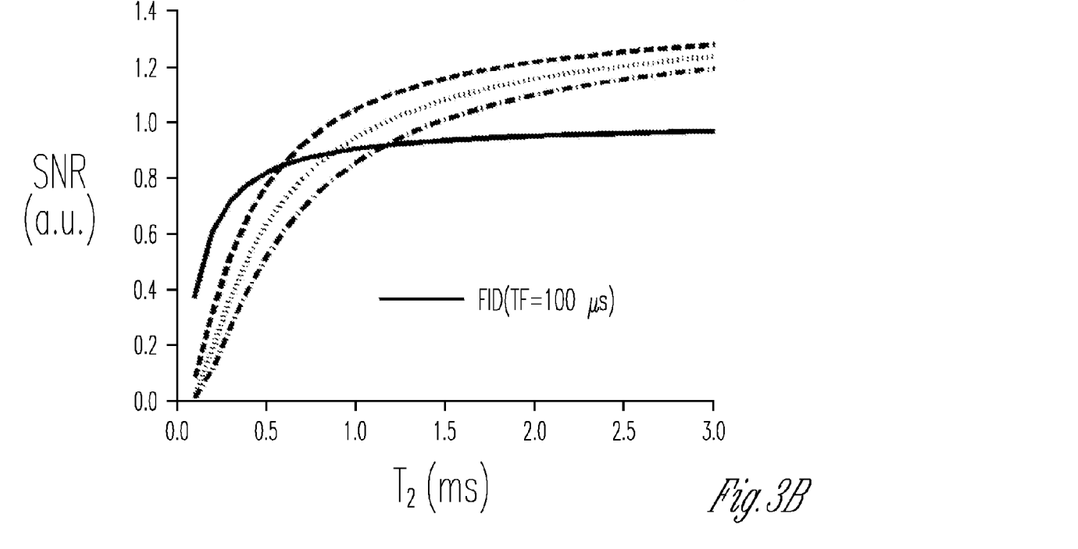

The following part describes some results using an example of the present subject matter. FIGS. 3A and 3B include signal to noise ratio (SNR) data.

Consider the graph in FIG. 3A. In this figure, factor $\lambda_f$ by which the SNR of the asymmetric echo is improved is plotted (calibrated in artificial units, a.u.) versus $T_{acq}$ for a different TE=300, 400, and 500 μs. The graph compares an example of the present subject matter with the SNR of the FID in UTE imaging. RT was assumed to be 200 μs. In particular, factor $\lambda_f$ for each different TE is approaching √2(≈1.414) as $T_{acq}$ increases, and the shorter TE has a slightly higher $\lambda_f$ than the longer TE.

FIG. 3B depicts the SNR of the FID and the asymmetric echo for different $T_2$ values. The SNR of the FID for an infinite long $T_2$ is normalized to 1, to which the SNR of the asymmetric echoes with different TEs are compared. The $T_2$ values ($T_{2,eq}$) at which the FID with an acquisition delay TF and the symmetric echo with TE are expected to have the same SNR can be calculated by $$T_{2,eq} = \frac{TE - TF}{\ln(\lambda_f)}, \quad \text{Equation 5}$$

when assuming that the maximum signal amplitude decays according to exp(−TE/$T_2$). Given TF and TE, the FID has a better SNR than the asymmetric echo for the $T_2$ species that have a shorter $T_2$ than $T_{2,eq}$, but the asymmetric echo has a better SNR than the FID for the longer than the $T_2$ species that have a longer $T_2$ than $T_{2,eq}$. For UTE imaging and the present subject matter, $T_{acq}$ was assumed to be 3.2 ms and TF was assumed to be 100 μs. For these given values of TF and TE, $T_{2,eq}$ is about 0.58, 0.87, and 1.17 ms.

According to one example, an HS excitation pulse does not require extra spoiling times because the resulting non-linear phase variation helps to prevent unwanted stimulated and spin echoes. One example of the present subject matter can offer shorter TR (≤4 ms) than conventional 3D radial sampling techniques or conventional 3D GRE techniques.

One example of the present subject matter can reduce the scan time with the same number of views as conventional 3D radial sampling techniques, or run more number of views with the same scan time. Furthermore, when it is modified to a version of balanced-steady-state free precession (SSFP), its ability to offer short TR is beneficial in eliminating banding artifacts due to the phase accumulation of resonance offsets in the presence of $B_0$ inhomogeneity and/or magnetic susceptibility variation.

According to one example of the present subject matter, since the HS pulse sequentially excites spins during the frequency sweep, the spin isochromats that are excited earlier or later will be rephased later or earlier in a symmetric way, which makes each isochromat maximally contribute to the pseudo-echo signal at a unique time. In this case, different isochromats have different TEs and, thus, each projection profile will have spatially varying $T_2$ (or $T_2^*$) dependence. However, according to simulation for chemical species with $T_2$=0.2, 0.5, 1, and 2 ms, in which the TE of an on-resonant isochromat was set to be 0.6 ms, the spatial variation of a 1D projection profile due to this effect is approximately 1.7, 0.8, 0.5, and 0.3%, respectively, over the bandwidth of 10 kHz. For a long $T_2$ species this effect is almost negligible.

One example of the present subject matter can be used for musculoskeletal (MSK) applications since hard tissues, such as meniscus, tendons, ligaments, and cortical bone etc, have a majority of short $T_2$ components whose $T_2$ values are on the order of a few hundred microseconds to a few milliseconds.

The ability to image hard tissues is not the only reason to achieve short TE in clinical MRI. For example, when dynamic contrast enhanced (DCE) MRI studies are performed at high magnetic field, a short TE sequence like SWIFT-LiTE can effectively reduce $T_2^*$ effects occurring with GRE acquisitions (TE>1 ms) which can distort time-intensity curves and, thus, lead to erroneous estimates of pharmacokinetic parameters. In addition, an example of the present subject matter can have utility in other applications, including imaging lung parenchyma, short $T_2$ phosphorus and sodium imaging, imaging cirrhosis in the liver, imaging calcifications and cavernomas, pituitary gland as well as myelin, capsules, and cerebral falx in the brain, and so forth.

Part 4

The following part describes image reconstruction according to one example.

According to one example, images can be reconstructed using gridding and fast Fourier transformation (FFT). Gridding is a method of image reconstruction and entails interpolating data in an arbitrary sampling pattern in order to produce a uniform grid. Before gridding, the origin of k-space (i.e., k=0) can be estimated by averaging the projections and finding the position of the maximum value. After rearranging the asymmetric echo of each spoke with respect to the newly determined position of k=0, gridding can be performed to distribute the data onto Cartesian coordinates, which includes convolution with a Kaiser-Bessel function for interpolation, followed by performing 3D FFT and deapodization due to the use of the interpolation, for reconstructing the final 3D images. Filtering can also be employed for improving SNR before the FT of the gridded data at the expense of resolution.

The present subject matter can be demonstrated for imaging in vivo human brain and ex vivo bovine knee. Experiments can be performed using a 90 cm 4T magnet interfaced to an imaging spectrometer. A proton-free TEM head resonator can be used to prevent unexpected background signal coming from the coil components (for example, the plastic used for coating the end-rungs may have a relatively long $T_2$). Using values of RT=0.2 ms, $T_p$=0.25 ms, and BW=80 kHz, images (without correcting for variable switching delays, eddy currents, or other instrumental imperfections) can be generated.

Figure 4A:
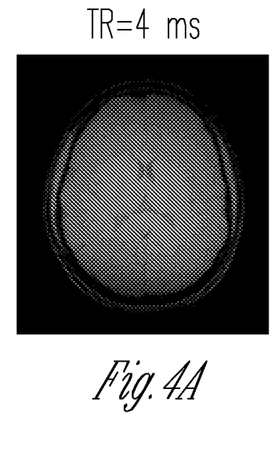
FIGS. 4A, 4B, and 4C include comparative images of a human brain.
Figure 4B:
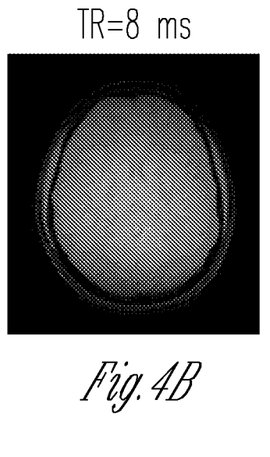
Figure 4C:
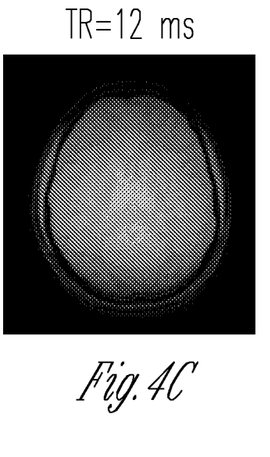

FIGS. 4A, 4B, and 4C include comparative images of a human brain according to the present subject matter using axial slices selected from the reconstructed 3D data. In the figures, TR=4 ms (FIG. 4A), 8 ms (FIG. 4B), and 12 ms (FIG. 4C) and illustrates a comparison of image contrast. Nominal flip angle=~5°. TE=0.65 ms, DT=0.1 ms, $T_{acq}$=3.2 ms, spherical field-of-view (FOV)=40 cm, and isotropic resolution=1 mm³. In the figures, eight spirals of views are interleaved to generate 56,000 projections (i.e., the number of views of each spiral=7,000). Scan time can be 224 s, 448 s, and 672 s, respectively. As shown in FIG. 4A, the image with the shortest TR=4 ms shows almost no contrast between gray matter and white matter because it has $T_1$-weighted contrast mixed up with proton-density weighted contrast. With increasing TR, the image contrast approaches proton-density weighting (FIG. 4B and FIG. 4C).

Figure 5A:
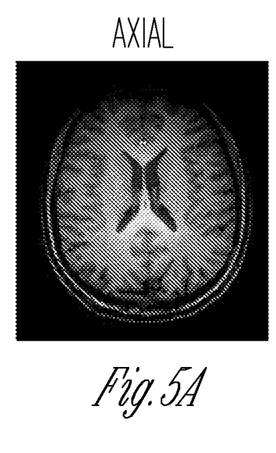
FIGS. 5A, 5B, and 5C include comparative images of a human brain.
Figure 5B:
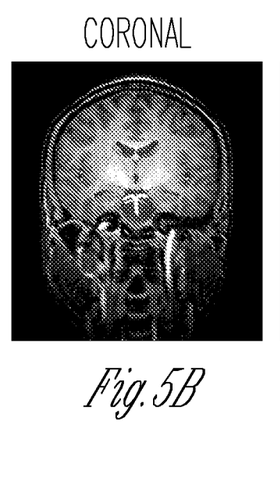
Figure 5C:
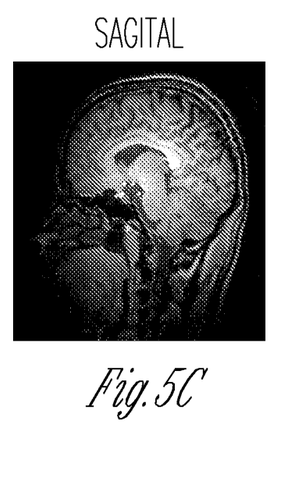
Figure 6A:
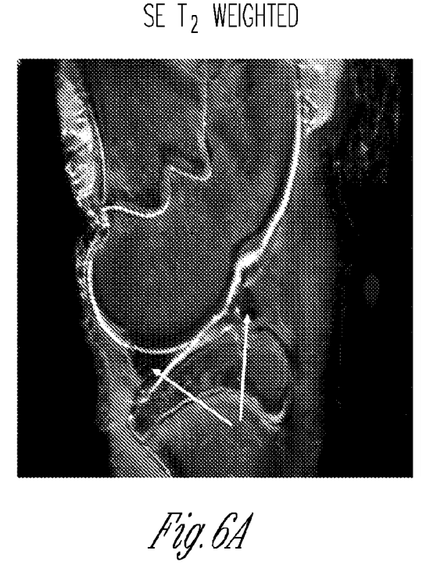
FIGS. 6A, 6B, 6C, and 6D include comparative images of a bovine knee.
Figure 6B:
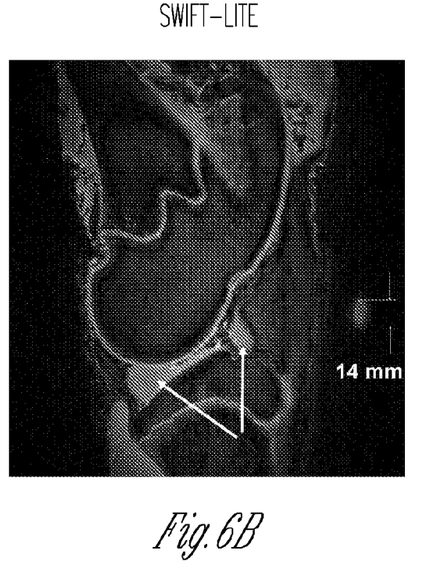
Figure 6C:
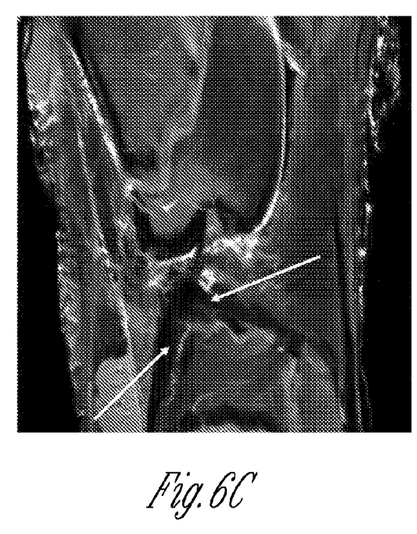
Figure 6D:
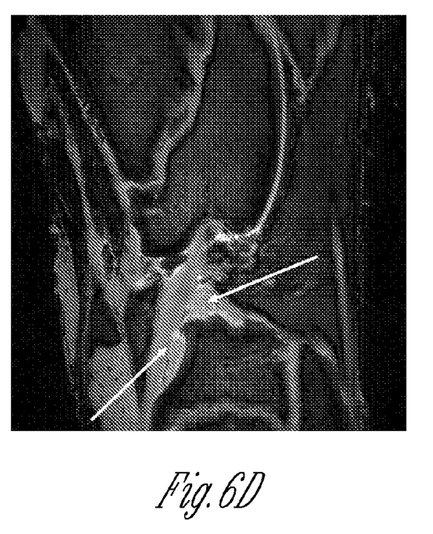

FIGS. 5A, 5B, and 5C include comparative images of a human brain, according to one example, a using a magnetization preparation pulse to enhance $T_1$-weighting. For each preparation (inversion) pulse, 200 views can be acquired. The delay time (TI) between the inversion pulse and acquisition can be 0.8 s. Nominal flip angle=~5°, TR/TE=4 ms/0.45 ms, DT=0, scan time=12 min, spherical FOV=35 cm, and isotropic resolution=1 mm³. Twelve spirals of views can be interleaved to generate 84,000 projections. The shading artifact in the orbital-frontal area is due to $B_1$ inhomogeneity.

The figures depict axial (FIG. 5A), coronal (FIG. 5B), and sagittal (FIG. 5C) images selected from the reconstructed 3D data.

FIGS. 6A, 6B, 6C, and 6D include comparative images of an ex vivo bovine knee with fat suppression, according to one example. FIG. 6 demonstrates that an example of the present subject matter can be used to detect signals from connective tissues like menisci and ligaments that have a majority of short $T_2$ components. A spectral-selective preparation pulse can be applied for fat suppression in every 200 acquisitions. Flip angle=~5°, TR/TE=4.4 ms/0.65 ms, scan time=~9 min, spherical FOV=30 cm, and isotropic resolution=0.65 mm³. Twenty spirals of views can be interleaved to generate 140,000 projections. For comparison, multi-slice $T_2$-weighted 2D spin-echo imaging is also presented, which may be used for meniscus imaging in clinic, can also be performed using slice thickness 5 mm. TR/TE=2 s/40 ms, FOV=30 cm, and matrix size=256×256. FIG. 6 illustrates sagittal images of the bovine knee sample data. The white arrows point out the anterior-horn and posterior-horn medial menisci in FIG. 6A, as well as anterior cruciate ligament (ACL) and posterior cruciate ligament (PCL) in FIG. 6C. Menisci and ligaments are revealed in images generated using the present subject. Menisci and ligaments appear dark in $T_2$-weighted 2D spin-echo imaging.

Part 5

The following part describes a theory according to one example.

The echo signal of a single isochromat with a frequency f (in Hz) and a transverse relaxation $T_2$ can be written as $$S_f(t) = \rho(f) e^{-t/T_2(f)} e^{-i2\pi f(t-TE)} \quad \text{Equation 6}$$

where $\rho(f)$ is the spin density of the given isochromat and TE is an echo time. If $\rho(f)$ and $T_2$ are assumed to be constant for all isochromats and $T_2$ is also infinitely large for the purpose of simplicity, the echo signal coming from an object whose size is in the range from −sw/2 to sw/2 (in Hz) by frequency encoding can be given by $$S(t) = \int_{-sw/2}^{sw/2} \rho \cdot e^{-i2\pi ft} df = \rho \cdot sw \cdot \mathrm{sinc}(\pi \cdot sw \cdot (t - TE)).\quad \text{Equation 7}$$

Equation 7 shows that the echo signal can be described in terms of a sinc function and the nth zero-crossing of the sinc function will happen at $t_n = TE \pm n/sw$, where n is a positive integer.

In SWIFT-LiTE, without any delay time (DT=0), the echo acquisition is expected to begin at $t=TE-RT-T_p/2$, where $t=0$ at the middle of RF excitation. Thus, for the proper comparison of the signal energy of an asymmetric echo with that of the conventional symmetric echo, it needs to be evaluated how many number of zero-crossing points can be included in the time duration of $T_p/2$. When the FM pulse like the HS pulse is used for excitation, R value is often used as a convenient descriptor for the analysis of the FM pulse, which is defined as the product of BW (in Hz) and $T_p$ (in s), i.e., $R=BW \cdot T_p$. If the spectral width of the readout (SW) is the same as BW, as is the case in SWIFT-LiTE, and sw is smaller than BW by a factor α, the first nth zero-crossing point can be rewritten as $$t_1 = TE - \frac{n}{sw} = TE - \frac{n}{\alpha BW} = TE - \frac{n}{\alpha R}T_p, \quad \text{Equation 8}$$

by introducing R and $T_p$ instead of BW.

According to Equation 8, the first nth zero-crossing points will correspond to $TE-T_p/2$ when the following condition is satisfied:

$$n = \frac{\alpha R}{2}. \quad \text{Equation 9}$$

For example, consider the asymmetric echo produced by the HS pulse with R=20. If α=1 (i.e., sw=BW), n=10. In other words, if the object size is the same as the FOV, the starting of acquisition of the asymmetric echo will correspond to the 10th zero-crossing point. If α=0.5 (i.e., sw=0.5BW), n=5. In practice, the FOV is often set to be 20% larger than the object size in radial sampling. In this case, α=0.8 (i.e., sw=0.8BW), and thus, n=8. For these three examples, the signal energy can be calculated by integrating the square of Equation 7 with respect to time in a numerical way. If the signal energy of the symmetric echo is normalized to 1, the signal energy of the asymmetric echo with n=5 will be 0.9898, i.e., 98.98% of that of the symmetric echo. With n=8, it will be 0.9936, i.e., 99.36% of that of the symmetric echo. With n=10, it will be 0.9949, i.e., 99.49% of that of the symmetric echo. In conclusion, the signal energy of the asymmetric echo amounts to about 99% of that of the conventional symmetric echo even when the FOV is the same as the object size (n=5).

Part 6

The following part describes a system according to one example.

Figure 7:
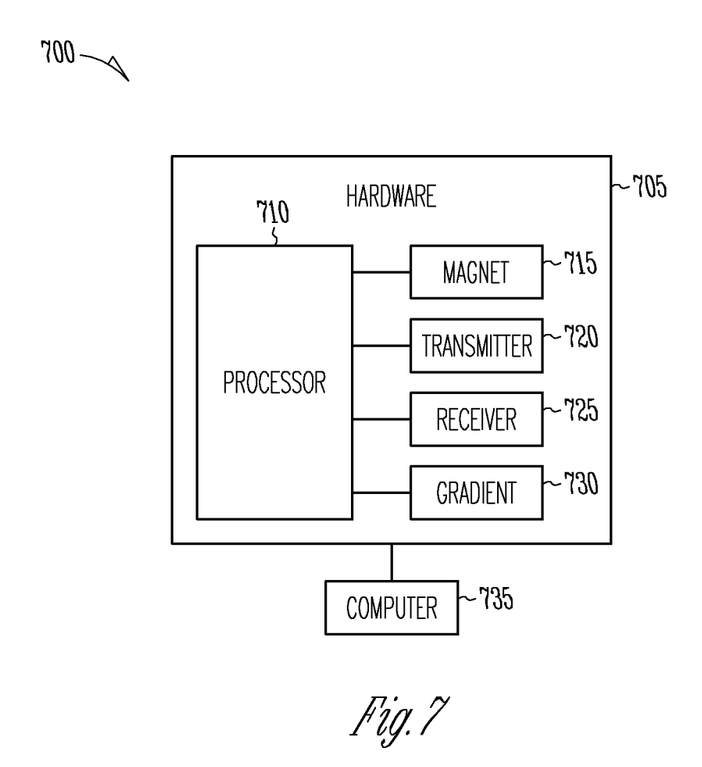
FIG. 7 includes a block diagram of a system according to one example.

FIG. 7 illustrates a view of system 700 according to one example. System 700 includes hardware 705 and computer 735. Hardware 705 includes magnet 715, transmitter 720, receiver 725, gradient 730, all of which are in communication with processor 710. Magnet 715 can include a permanent magnet, a superconducting magnet, or other type of magnet. Transmitter 720, along with receiver 725, are part of the RF system. Transmitter 720, in the figure, can represent a radio frequency transmitter, a power amplifier, and an antenna (or coil). Receiver 725, as denoted in the figure, can represent a receiver antenna (or coil) and an amplifier. In the example shown, transmitter 720 and receiver 725 are separately represented, however, in one example, transmitter 720 and receiver 725 share a common coil and are jointly referred to as a transceiver.

Hardware 705 includes gradient 730. Gradient 730 can represent one or more coils used to apply a gradient for localization.

Processor 710, in communication with the various elements of hardware 705, includes one or more processors configured to implement a set of instructions corresponding to a method as disclosed herein. For example, processor 710 can be configured to implement a set of instructions (stored in a memory of hardware 700) to deliver RF excitation and gradients and receive magnetic resonance data from the specimen.

Computer 735 is coupled to hardware 705. Computer 735 can include one or more of a desktop computer, a workstation, a server, or a laptop computer. In one example, computer 735 is user-operable and includes a display, a printer, a network interface or other hardware to allow enable an operator to control operation of system 700.

An example of the present subject matter enables detection of short $T_2$ species without specialized hardware. For example, a magnetic resonance imaging system having typical performance (in terms of peak RF power, T/R switching time, coil ring down time, and gradient performance) can be used to implement one example of the present subject matter and provide improved SNR relative to conventional UTE imaging or other imaging techniques. An example of the present subject matter may also avoid technical challenges (such as non-uniform sampling and phasing) that are sometimes encountered with conventional UTE imaging sequences in which data acquisition occurs during the gradient ramp.

Additional Notes

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code may be tangibly stored on one or more volatile or non-volatile computer-readable media during execution or at other times. These computer-readable media may include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

The claimed invention is:

1. A magnetic resonance imaging system comprising:
 a magnet operable to provide a magnetic field;
 a transmitter operable to transmit to a region within the magnetic field;
 a receiver operable to receive a magnetic resonance signal from the region; and
 a processor coupled to the transmitter and coupled to the receiver, the processor operable to cause the transmitter to provide, to the region, a radio frequency excitation pulse, a first gradient, and a readout gradient and operable to cause the receiver to generate magnetic resonance data based on the magnetic resonance signal, the processor configured to provide the radio frequency excitation pulse concurrent with the first gradient, the radio frequency excitation pulse having a duration and the first gradient having a first polarity, and after the duration, operable to provide the readout gradient, the readout gradient having an inverse polarity rely to the first polarity, and receive the magnetic resonance signal while providing the readout gradient, and the processor operable to generate an image based on the magnetic resonance data and wherein the image corresponds to a 3D radial image based on k-space data and wherein the first gradient corresponds to a spoke in the k-space data.

2. The magnetic resonance imaging system of claim 1, wherein the processor is operable to provide a time delay between the duration and the readout gradient.

3. The magnetic resonance imaging system of claim 1, wherein the radio frequency excitation pulse includes a frequency modulated pulse.

4. A method of operating a magnetic resonance scanner, the method comprising:
 providing a radio frequency excitation pulse to a specimen, the radio frequency excitation pulse having a duration;
 concurrent with providing the radio frequency excitation pulse, applying a first gradient having a first polarity, wherein applying the first gradient includes selecting a spoke in k-space data, the k-space data corresponding to a radial image;
 applying a readout gradient at a time after the duration, the readout gradient having inverse polarity relative to the first polarity;
 acquiring magnetic resonance data from the specimen while applying the readout gradient; and
 generating an image based on the magnetic resonance data.

5. The method of claim 4, wherein a magnitude of the readout gradient is substantially equal to a magnitude of the first gradient.

6. The method of claim 4, further including waiting a delay period after the duration and before applying the readout gradient.

7. The method of claim 4, wherein providing the radio frequency excitation pulse includes applying a frequency modulated pulse.

8. The method of claim 4, wherein providing the radio frequency excitation pulse includes applying at least one of a hyperbolic secant pulse or a sinc pulse.

9. The method of claim 4, wherein generating the image includes gridding.

10. The method of claim 4, wherein generating the image includes executing a Fourier transform.

* * * * *